(12) United States Patent
Yang et al.

(10) Patent No.: US 12,300,573 B2
(45) Date of Patent: May 13, 2025

(54) SEMICONDUCTOR DEVICE AND MANUFACTURING METHOD THEREOF

(71) Applicant: MEDIATEK Inc., Hsin-Chu (TW)

(72) Inventors: Bo-Jiun Yang, Hsinchu (TW); Wen-Sung Hsu, Hsinchu (TW); Tai-Yu Chen, Hsinchu (TW); Sheng-Liang Kuo, Hsinchu (TW); Chia-Hao Hsu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 359 days.

(21) Appl. No.: 17/700,571

(22) Filed: Mar. 22, 2022

(65) Prior Publication Data

US 2022/0328378 A1 Oct. 13, 2022

Related U.S. Application Data

(60) Provisional application No. 63/172,124, filed on Apr. 8, 2021.

(51) Int. Cl.
*H01L 23/42* (2006.01)
*H01L 21/48* (2006.01)
(Continued)

(52) U.S. Cl.
CPC .......... *H01L 23/42* (2013.01); *H01L 21/4817* (2013.01); *H01L 23/427* (2013.01);
(Continued)

(58) Field of Classification Search
CPC ..... H01L 23/42; H01L 21/4817; H01L 24/16; H01L 24/32; H01L 24/73; H01L 2224/16225; H01L 2224/32225; H01L 2224/73204; H01L 2924/1611; H01L 2924/16151; H01L 2924/1616; H01L 2924/16235; H01L 2924/16251; H01L 2924/16315; H01L 2924/1632; H01L 23/3128; H01L 21/4882; H01L 23/3672; H01L 23/473; H01L 23/433; H01L 23/427

See application file for complete search history.

(56) References Cited

U.S. PATENT DOCUMENTS 10,643,924 B1 * 5/2020 Shen ................... H01L 25/0655
2001/0026957 A1   10/2001 Atwood
(Continued)

FOREIGN PATENT DOCUMENTS

| CN | 100539052 C | 9/2009 |
|---|---|---|
| EP | 4071799 A1 | 10/2022 |
| JP | S6084848 A | 5/1985 |

OTHER PUBLICATIONS

EP Search Report dated Aug. 21, 2023 in EP application No. 23163214.2-1211.
(Continued)

*Primary Examiner* — Patricia D Valenzuela
(74) *Attorney, Agent, or Firm* — McClure, Qualey & Rodack, LLP

(57) ABSTRACT

A semiconductor device includes a substrate, an electronic component, a cover and a liquid metal. The electronic component is disposed on the substrate. The cover is disposed on the substrate and covers the electronic component. The liquid metal is formed between the cover and the electronic component.

22 Claims, 6 Drawing Sheets

(51) Int. Cl.
    *H01L 23/00*         (2006.01)
    *H01L 23/427*      (2006.01)
    *H01L 23/433*      (2006.01)

(52) U.S. Cl.
    CPC ............ *H01L 23/433* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/1611* (2013.01); *H01L 2924/16151* (2013.01); *H01L 2924/1616* (2013.01); *H01L 2924/16235* (2013.01); *H01L 2924/16251* (2013.01); *H01L 2924/16315* (2013.01); *H01L 2924/1632* (2013.01)

(56) References Cited

U.S. PATENT DOCUMENTS

| | | |
|---|---|---|
| 2004/0036183 A1 | 2/2004 | Im |
| 2004/0262766 A1 | 12/2004 | Houle |
| 2006/0118925 A1 | 6/2006 | Macris |
| 2006/0220225 A1 | 10/2006 | Ni |
| 2007/0205473 A1 | 9/2007 | Youngner et al. |
| 2018/0151472 A1 | 5/2018 | Chen |
| 2019/0393118 A1 | 12/2019 | Rawlings |
| 2020/0168523 A1 | 5/2020 | Huang |
| 2020/0227336 A1 | 7/2020 | Eid |
| 2020/0388554 A1 | 12/2020 | Falola |
| 2020/0402885 A1 | 12/2020 | Kim |
| 2021/0249333 A1* | 8/2021 | Lewison ............... H01L 23/427 |
| 2022/0375813 A1 | 11/2022 | Huang |

OTHER PUBLICATIONS

TW Office Action dated Mar. 5, 2024 in Taiwan application No. 112108693.
TW Office Action dated May 15, 2024 in Taiwan application No. 112108693.
EP Search Report dated Sep. 5, 2022 in European application No. 22165924.6-1211.
TW Office Action dated Jul. 15, 2024 in Taiwan application No. 112108693.
EP Search Report dated Jul. 29, 2024 in European application No. 24157974.7-1211.

* cited by examiner

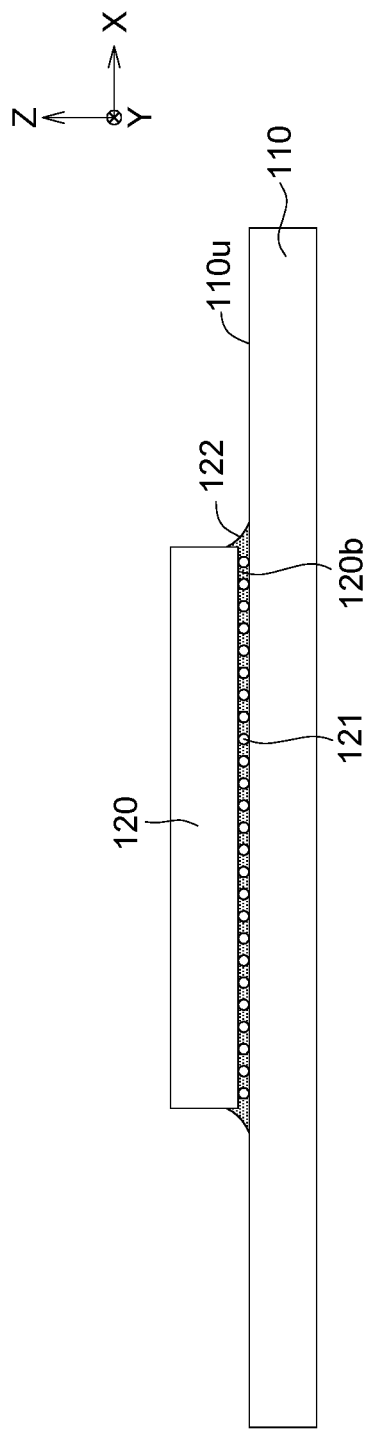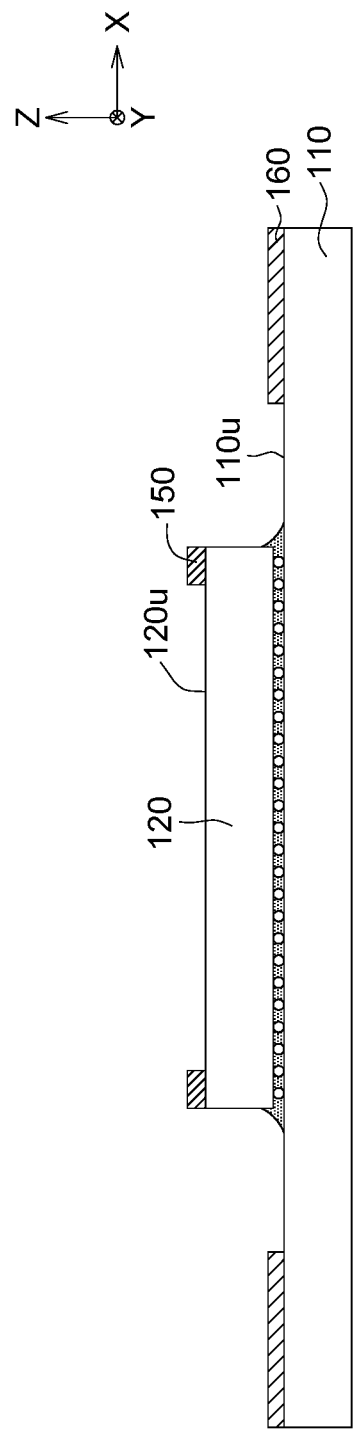

SEMICONDUCTOR DEVICE AND MANUFACTURING METHOD THEREOF

This application claims the benefit of U.S. Provisional application Ser. No. 63/172,124, filed Apr. 8, 2021, the disclosure of which is incorporated by reference herein in its entirety.

FIELD OF THE INVENTION

The invention relates to a semiconductor device and a manufacturing method thereof, and more particularly to a semiconductor device including a liquid metal and a manufacturing method thereof.

BACKGROUND OF THE INVENTION

Conventional semiconductor device includes a substrate and an electronic component disposed on the substrate. However, the electronic component inevitably generates heat during operation. Thus, how to dissipate the heat from the electronic component has become a prominent task for the industries.

SUMMARY OF THE INVENTION

In one embodiment of the invention, a semiconductor device is provided. The semiconductor device includes a substrate, an electronic component, a cover and a liquid metal. The electronic component is disposed on the substrate. The cover is disposed on the substrate and covers the electronic component. The liquid metal is formed between the cover and the electronic component.

In another embodiment of the invention, a semiconductor method is provided. The manufacturing method includes the following steps: disposing an electronic component on a substrate; disposing a cover on the substrate to cover the electronic component; and forming a liquid metal between the cover and the electronic component.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIGS. 2A to 2E illustrate manufacturing processes of the semiconductor device of FIG. 1B.

DETAILED DESCRIPTION OF PREFERRED EMBODIMENTS

Figure 1A:
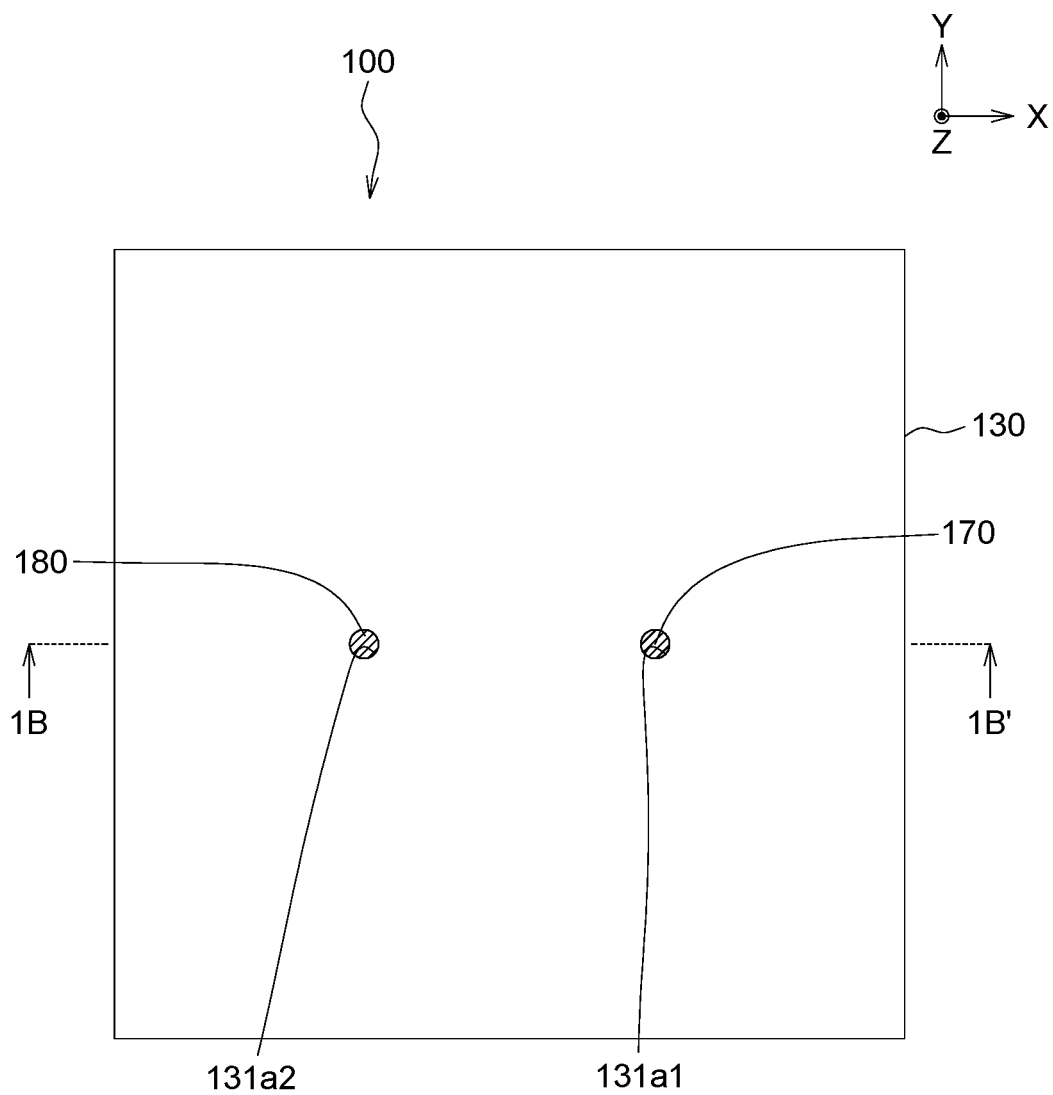
FIG. 1A illustrates a diagram view of a top view of a semiconductor device according to an embodiment of the invention.
Figure 1B:
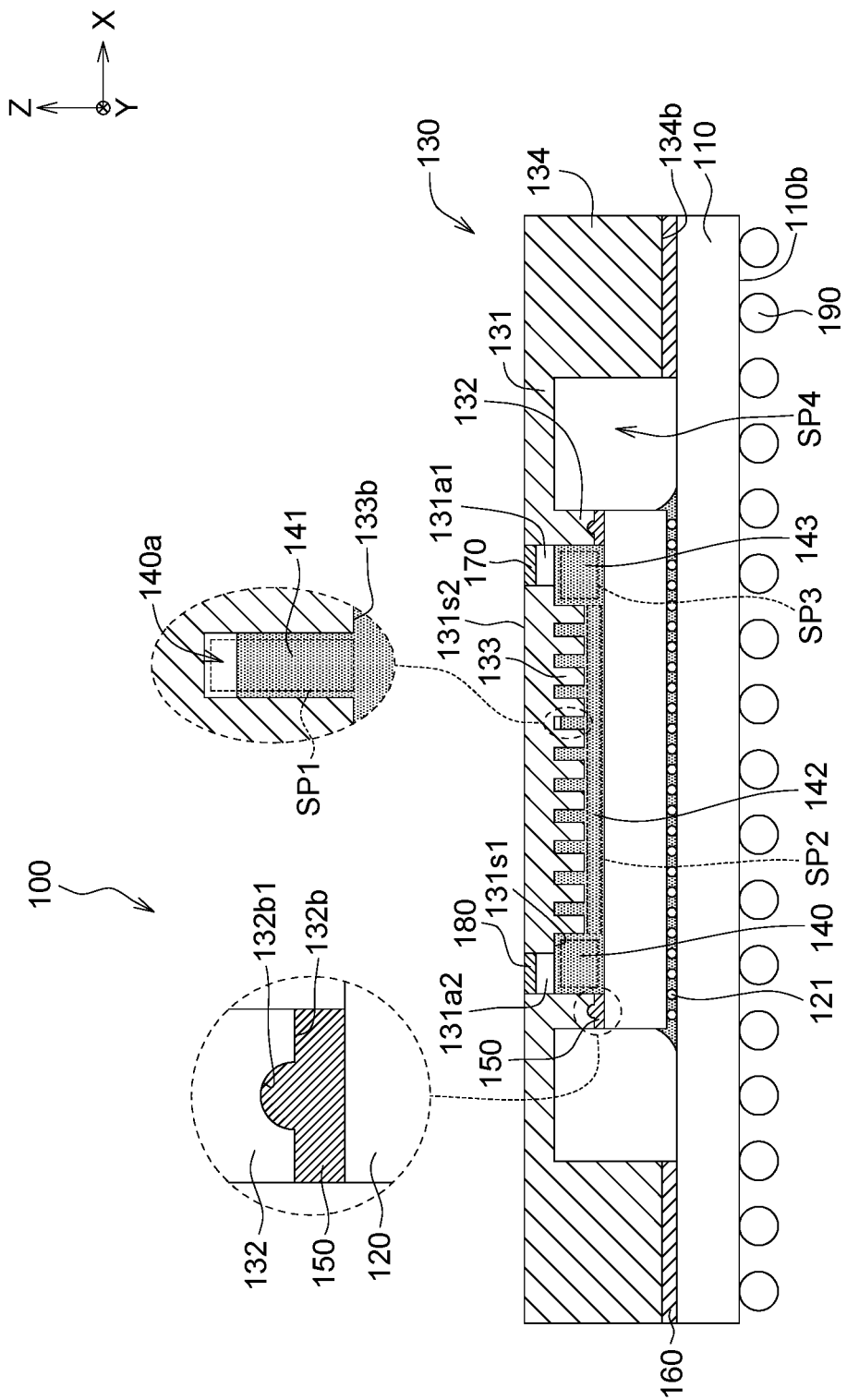
FIG. 1B illustrates a cross-sectional views of the semiconductor device of FIG. 1A along a direction 1B-1B'.
Figure 1C:
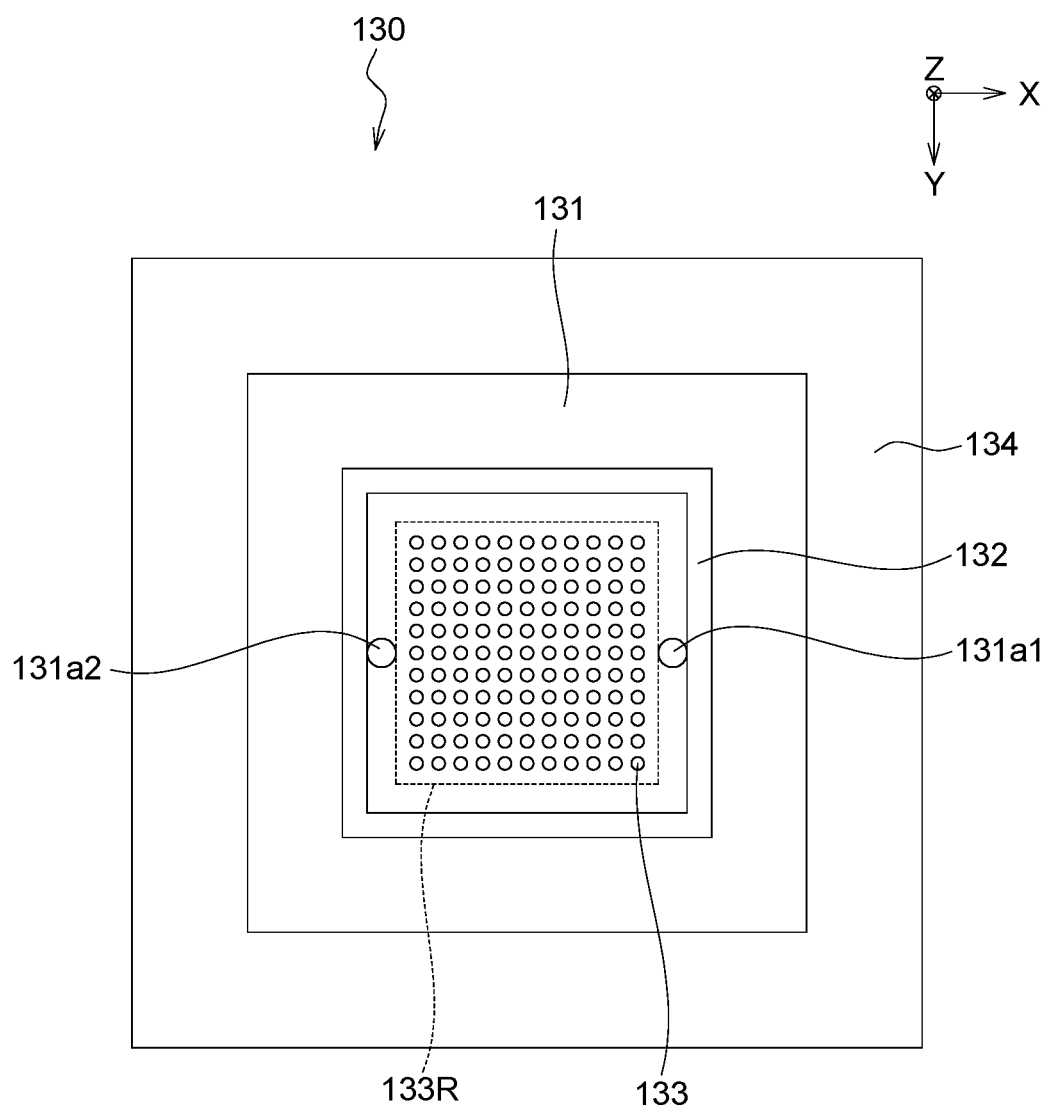
FIG. 1C illustrates a diagram view of a bottom view of a cover of FIG. 1B.

Referring to FIGS. 1A to 1C, FIG. 1A illustrates a diagram view of a top view of a semiconductor device 100 according to an embodiment of the invention, FIG. 1B illustrates a cross-sectional views of the semiconductor device 100 of FIG. 1A along a direction 1B-1B', and FIG. 1C illustrates a diagram view of a bottom view of a cover 130 of FIG. 1B.

The semiconductor device 100 is, for example, a Flip Chip Ball Grid Array (FCBGA), such as a High Performance FCBGA; however, such exemplification is not meant to be for limiting.

As illustrated in FIGS. 1A and 1B, the semiconductor device 100 includes a substrate 110, an electronic component 120, a cover 130, a liquid metal 140, a first adhesive layer 150, a second adhesive layer 160, a first seal 170, a second seal 180 and at least one conductive portion 190.

As illustrated in FIG. 1B, the electronic component 120 is disposed on the substrate 110. The cover 130 is disposed on the substrate 110 and covers the electronic component 120. The liquid metal 140 is formed between the cover 130 and the electronic component 120. As a result, the heat generated by the electronic component 120 could be dissipated through the liquid metal 140 and the cover 130.

The substrate 110 has, for example, single-layered structure or multi-layered structure. Although not illustrated, the substrate 110 includes at least one conductive trace, at least one conductive via and/or at least one conductive pad, wherein the conductive traces are electrically connected with at least one conductive via. In an embodiment, the substrate 110 is, for example, a printed circuit board (PCB), an interposer, another semiconductor device or a semiconductor package.

The electronic component 120 is electrically connected with the conductive portion 190 through the substrate 110. The electronic component 120 is, for example, the component capable of applying to (or disposed on) a package requiring high-power operation, such as Flip Chip BGA (FCBGA), Fan-out package, 3D (three-dimension) IC (Integrated Circuit) package, etc. The electronic component 120 includes at least one conductive portion 121, wherein the conductive portion 121 is, for example, bump or solder ball. The electronic component 120 is bonded to the at least one conductive pad (not illustrated) of the substrate 110 through at least one conductive portion 121.

The cover 130 is made by a material, for example, metal, such as copper, aluminum, iron or a combination thereof. The cover 130 could conduct heat and increased strength of the semiconductor device 100 for reducing warpage.

As illustrated in FIGS. 1B and 1C, the cover 130 includes a plate 131, a first surrounding portion 132, at least one pillar 133 and a second surrounding portion 134. The plate 131 has a first surface 131$s$1 and a second surface 131$s$2 opposite to the first surface 131$s$1. The first surface 131$s$1 faces the electronic component 120. The first surrounding portion 132, the pillars 133 and the second surrounding portion 134 are disposed on the plate 131 and protrude with respect to (or relative to) the first surface 131$s$1. The first surrounding portion 132 is, for example, a closed-ring for surrounding the whole of the liquid metal 140. Since the pillars 133 protrude with respect to the first surface 131$s$1, and accordingly it could increase heat conduction area of the cover 130. The second surrounding portion 134 surrounds the first surrounding portion 132, the pillars 133, the electronic component 120 and the liquid metal 140. The second surrounding portion 134 is a closed-ring for surrounding the whole of the first surrounding portion 132, the pillars 133, the electronic component 120 and the liquid metal 140.

As illustrated in FIGS. 1A to 1C, the cover 130 has a first through hole 131$a$1 and a second through hole 131$a$2. In the present embodiment, the first through hole 131a1 and the second through hole 131a2 are located at the plate 131. For example, the first through hole 131a1 and the second through hole 131a2 both extend to the second surface 131s2 from the first surface 131s1. As a result, during injection of the liquid metal 140, the liquid metal 140 flows into through the first through hole 131a1, and air (if any) could be discharged through the second through hole 131a2.

As illustrated in FIGS. 1A to 1C, the first through hole 131a1 and the second through hole 131a2 are located adjacent to first surrounding portion 132. The first through hole 131a1 and the second through hole 131a2 are located between the whole region 133R of the pillars 133 and the first surrounding portion 132. In the present embodiment, the first through hole 131a1 and the second through hole 131a2 are disposed at two opposite sides of the whole region 133R or the first surrounding portion 132, and thus distance between the first through hole 131a1 and the second through hole 131a2 is long. As a result, during injection of the liquid metal 140, the liquid metal 140 flows into through the first through hole 131a1, and most air could be discharged through the second through hole 131a2. In another embodiment, the first through hole 131a1 and the second through hole 131a2 could be disposed at two opposite corners of the whole region 133R or the first surrounding portion 132 (that is, at two end of the diagonal line of the whole region 133R or the first surrounding portion 132). As a result, the distance between the first through hole 131a1 and the second through hole 131a2 is longest, and accordingly it is more conducive to exhausting the air. In another embodiment, the second through hole 131a2 could be omitted, and the first through hole 131a1 could be disposed at middle position of the second surface 131s2 of the plate 131 or other position of the plate 130.

In terms of the property, the liquid metal 140 has melting point ranging between 60° C. to 70° C., less or higher. During injection of the liquid metal 140, the liquid metal 140 is pre-heated to be at flowable state, injected into space between the cover 130 and the electronic component 120 through the first through hole 131a1, and then solidified, without curing, by cooling or temperature drop. In addition, the liquid metal 140 has thermal conductivity ranging between the 70 W/m-K to 80 W/m-K, or higher. The thermal conductivity of the liquid metal 140 is higher than that of the thermal Interface Material (TIM). Generally, the TIM has thermal conductivity ranging between 2 W/m-K to 5 W/m-K.

As illustrated in FIG. 1B, the liquid metal 140 is formed among the cover 130 and the electronic component 120 as a heat transfer medium. Furthermore, there are a first receiving portion SP1 formed between adjacent two pillars 133, a second receiving portion SP2 formed between a terminal 133b of each pillar 133 and the electronic component 120, and a third receiving portion SP3 formed between the first surrounding portion 132, the first surface 131s1, the outermost pillar 133 and the electronic component 120. Viewed from top of the third receiving portion SP3, the third receiving portion SP3 has a ringed-shape, for example, a closed ringed-shape. The liquid metal 140 includes at least one first metal portion 141, a second metal portion 142 and a third metal portion 143. The first metal portion 141 fills up at least portion of each first receiving portion SP1, the second metal portion 142 fills up at least portion of the second receiving portion SP2, and the third metal portion 143 fills up at least portion of the third receiving portion SP3. As a result, even if the liquid metal 140 has at least one void (or air layer) 140a, the heat generated by the electronic component 120 still could be dissipated through other heat conduction part, such as the first metal portion 141, the second metal portion 142 and the third metal portion 143 which connect the cover 130 and electronic component 120.

In addition, as illustrated in FIG. 1B, there is space SP4 formed among the plate 131, the first surrounding portion 132 and the second surrounding portion 134. There is no physical material formed within the space SP4, for example.

As illustrated in FIG. 1B, the first adhesive layer 150 is disposed between a terminal 132b of the first surrounding portion 132 and the electronic component 120 for fixing relative position between the first surrounding portion 132 and the electronic component 120. In an embodiment, viewed from top of the first adhesive layer 150, the first adhesive layer 150 has a ringed-shape, for example, a closed ringed-shape for closing the gap (if any) between the first surrounding portion 132 and the electronic component 120. As a result, the liquid metal 140 could be prevented from leaking through the first surrounding portion 132 and the electronic component 120. In addition, the terminal 132b has a concave 132b1 for receiving a portion of the first adhesive layer 150, and accordingly it could increase adhesion between the first surrounding portion 132 and the electronic component 120.

As illustrated in FIG. 1B, the second adhesive layer 160 is disposed between a terminal 134b of the second surrounding portion 134 and the substrate 110 for fixing relative position between the cover 130 and the substrate 110. In an embodiment, viewed from top of the second adhesive layer 160, the second adhesive layer 160 has a ringed-shape, for example, a closed ringed-shape for closing the gap (if any) between the second surrounding portion 134 and the substrate 110. As a result, an external impurity is prevented from invading interior of the semiconductor device 100 through the second surrounding portion 134 and the substrate 110.

As illustrated in FIG. 1B, the first seal 170 closes or seals the first through hole 131a1. As a result, the liquid metal 140 is prevented from leaking through the first through hole 131a1, and an external impurity is prevented from invading an interior of the semiconductor device 100 through the first through hole 131a1. In addition, there is space between the first seal 170 and the third metal portion 143 of the liquid metal 140, and there is no physical material formed within the space, and thus the space could receive the thermal expansion of the third metal portion 143.

As illustrated in FIG. 1B, the second seal 180 closes the second through hole 131a2. As a result, the liquid metal 140 is prevented from leaking through the second through hole 131a2, and an external impurity is prevented from invading an interior of the semiconductor device 100 through the second through hole 131a2. In addition, there is space between the second seal 180 and the third metal portion 143 of the liquid metal 140, and there is no physical material formed within the space, and thus the space could receive the thermal expansion of the third metal portion 143.

As illustrated in FIG. 1B, the first adhesive layer 150, the second adhesive layer 160, the first seal 170 and the second seal 180 seal the receiving portions among the cover 130 and the electronic component 120 within.

As illustrated in FIG. 1B, the conductive portions 190 are formed on a lower surface 110b of the substrate 110. Any one of the conductive portions 190 is, for example, bump, solder ball, etc. The semiconductor device 100 is bonded to and electrically connected with an external electronic device (for example, PCB, etc.) through the conductive portions 190 of the semiconductor device 100.

Referring to FIGS. 2A to 2E, FIGS. 2A to 2E illustrate manufacturing processes of the semiconductor device 100 of FIG. 1B.

As illustrated in FIG. 2A, the electronic component 120 is disposed on the substrate 110, wherein the electronic component 120 includes at least one conductive portion 121, wherein the electronic component 120 is bonded to the substrate 110 through at least one conductive portion 121. In addition, an underfill 122 is formed between a lower surface 120b of the electronic component 120 and an upper surface 110u of the substrate 110 to encapsulate the conductive portions 121.

As illustrated in FIG. 2B, the first adhesive layer 150 is formed on an upper surface 120u of the electronic component 120, wherein the first adhesive layer 150 is formed on an peripheral zone of the upper surface 120u. Viewed from top of the first adhesive layer 150, the first adhesive layer 150 has a ringed-shape, for example, a closed ringed-shape.

As illustrated in FIG. 2B, the second adhesive layer 160 is formed on the upper surface 110u of the substrate 110, wherein the second adhesive layer 160 is formed on an peripheral zone of the upper surface 110u. Viewed from top of the second adhesive layer 160, the second adhesive layer 160 has a ringed-shape, for example, a closed ringed-shape.

In addition, the embodiment of the present invention does not limit the order of forming the first adhesive layer 150 and the second adhesive layer 160.

Figure 2C:
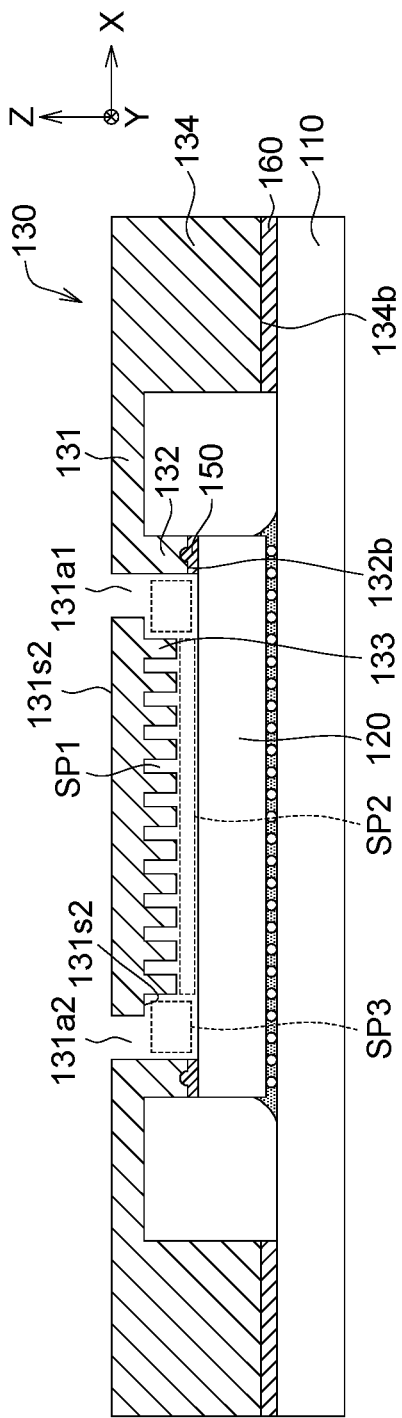

As illustrated in FIG. 2C, the cover 130 is disposed on the substrate 110 to cover the electronic component 120. The cover 130 includes the plate 131, the first surrounding portion 132, at least one pillar 133 and the second surrounding portion 134. The cover 130 has the first through hole 131a1 and the second through hole 131a2, wherein the first through hole 131a1 and the second through hole 131a2 both extend to the second surface 131s2 of the plate 131 from the first surface 131s1 of the plate 131.

In FIG. 2C, the first surrounding portion 132 of the cover 130 adheres to the electronic component 120 through the first adhesive layer 150, and the second surrounding portion 134 of the cover 130 adheres to the substrate 110 through the second adhesive layer 160 for fixing the relative position between the substrate 110 and the cover 130. The first adhesive layer 150 could close the gap (if any) between the first surrounding portion 132 and the electronic component 120, and the second adhesive layer 160 could close the gap (if any) between the second surrounding portion 134 and the substrate 110.

In FIG. 2C, there are the first receiving portion SP1 formed between adjacent two pillars 133, the second receiving portion SP2 formed between the terminal 133b of each pillar 133 and the electronic component 120, and the third receiving portion SP3 formed between the first surrounding portion 132, the first surface 131s1, the outermost pillar 133 and the electronic component 120. Viewed from top of the third receiving portion SP3, the third receiving portion SP3 has a ringed-shape, for example, a closed ringed-shape.

Figure 2D:
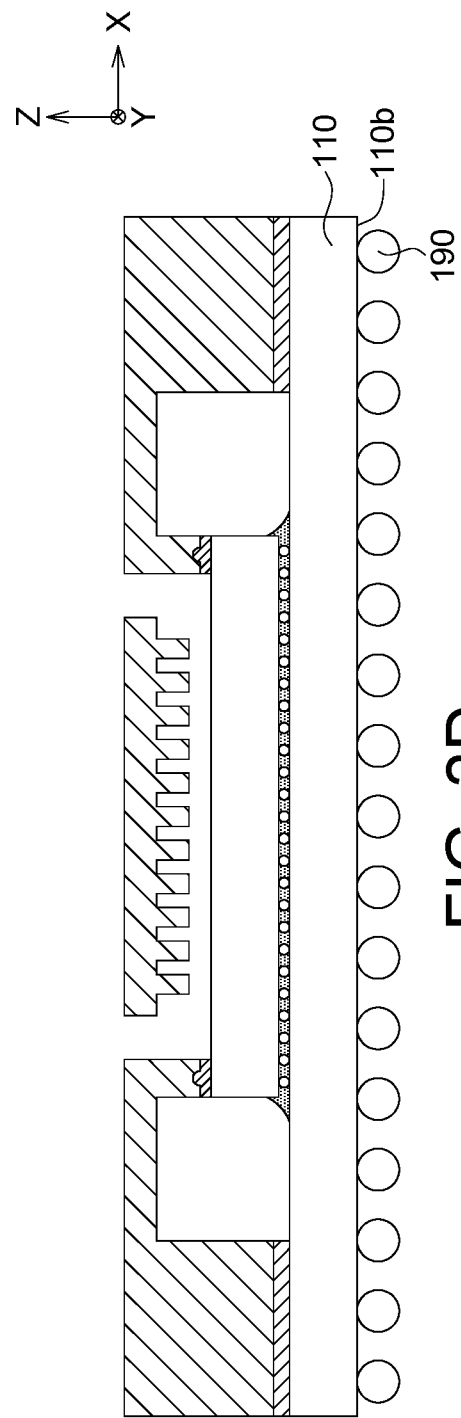

As illustrated in FIG. 2D, at least one conductive portion 190 is formed on the lower 110b of the substrate 110.

Figure 2E:
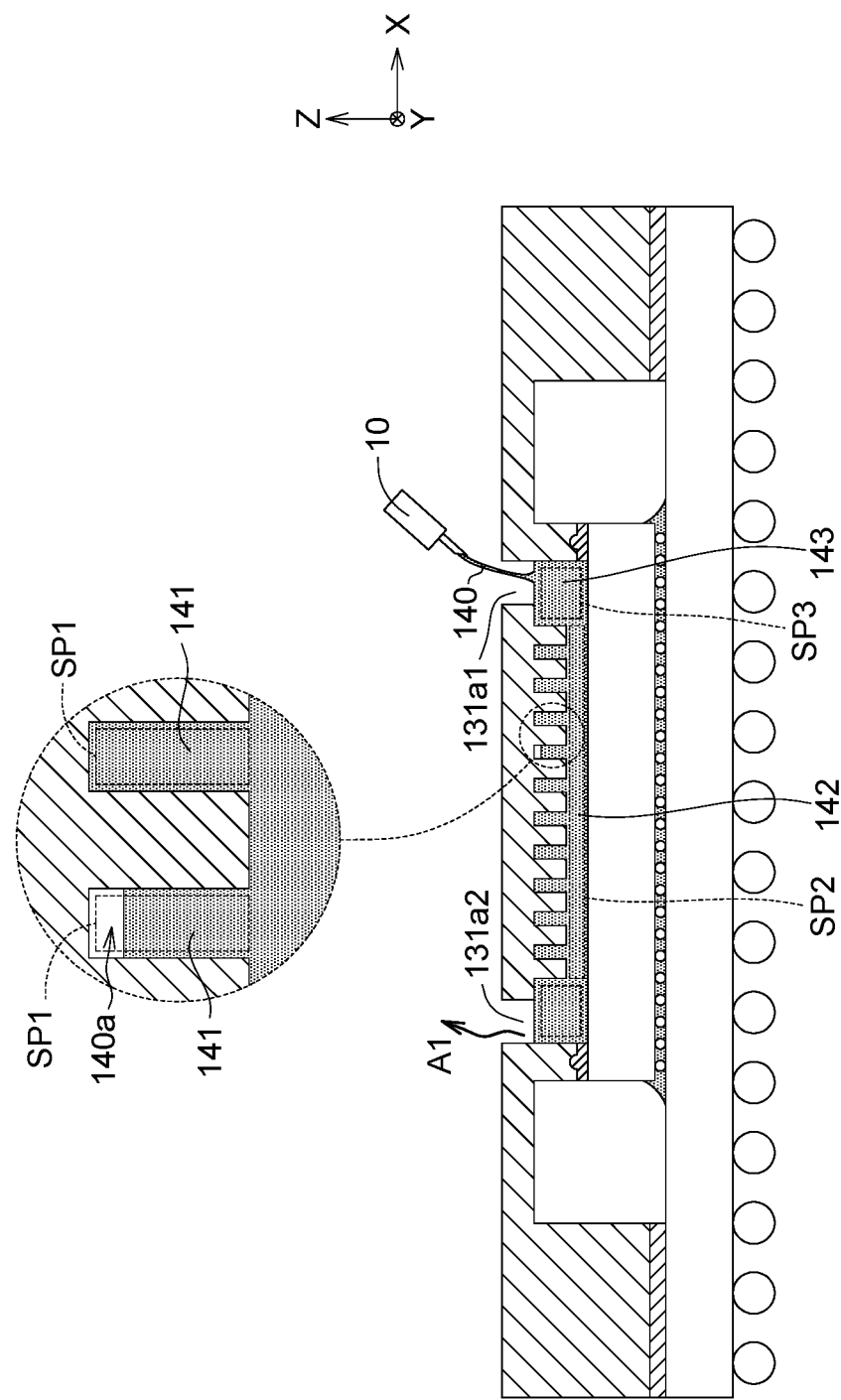

As illustrated in FIG. 2E, the liquid metal 140 is formed between the cover 130 and the electronic component 120 by using injector 10. For example, the liquid metal 140 is injected into the first receiving portion SP1, the second receiving portion SP2 and the third receiving portion SP3 through the first through hole 131a1, and gas (for example, air) A1 is discharged through the second through hole 131a2.

In FIG. 2E, the liquid metal 140 includes at least one first metal portion 141, the second metal portion 142 and the third metal portion 143. The first metal portion 141 fills up at least portion of each first receiving portion SP1, the second metal portion 142 fills up at least portion of the second receiving portion SP2, and the third metal portion 143 fills up at least portion of the third receiving portion SP3. Due to many portions (for example, the first metal portions 141, the second metal portion 142 and the third metal portion 143) connecting the cover 130 and electronic component 120, even if the liquid metal 140 has at least one void (or air layer) 140a, the heat generated by the electronic component 120 still could be dissipated through other heat conduction part, such as the first metal portion 141, the second metal portion 142 and the third metal portion 143 which connect the cover 130 and electronic component 120.

Then, the first seal 170 is formed within the first through hole 131a1 to seal the first through hole 131a1, as illustrated in FIG. 1B. As a result, the liquid metal 140 is prevented from leaking through the first through hole 131a1, and an external impurity is prevented from invading an interior of the semiconductor device 100 through the first through hole 131a1. In addition, there is space between the first seal 170 and the third metal portion 143 of the liquid metal 140, and there is no physical material formed within the space, and thus the space could receive the thermal expansion of the third metal portion 143.

Then, the second seal 180 is formed within the second through hole 131a2 to seal the second through hole 131a2, as illustrated in FIG. 1B. As a result, the liquid metal 140 is prevented from leaking through the second through hole 131a2, and an external impurity is prevented from invading an interior of the semiconductor device 100 through the second through hole 131a2. In addition, there is space between the second seal 180 and the third metal portion 143 of the liquid metal 140, and there is no physical material formed within the space, and thus the space could receive the thermal expansion of the third metal portion 143.

In addition, the embodiment of the present invention does not limit the order of forming the first seal 170 and the second seal 180.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
   a substrate;
   an electronic component disposed on the substrate;
   a cover disposed on the substrate and covering the electronic component; and
   a liquid metal formed between the cover and the electronic component;
   wherein the cover further comprises:
   a first surrounding portion surrounding the liquid metal, and
   a second surrounding portion;
   wherein there is space located between the first surrounding portion and the second surrounding portion.

2. The semiconductor device as claimed in claim 1, wherein the liquid metal has melting point ranging between 60° C. to 70° C.

3. The semiconductor device as claimed in claim 1, wherein the cover comprises:
   a plate having a first surface facing the electronic component;
   wherein the first surrounding portion is disposed on the plate and protruding with respect to the first surface;
   wherein the liquid metal is formed between the plate and the electronic component.

4. The semiconductor device as claimed in claim 3, wherein the first surrounding portion is a closed-ring.

5. The semiconductor device as claimed in claim 1, wherein the cover comprises:
   a plate having a first surface facing the electronic component; and
   a plurality of pillars disposed on the plate and protruding with respect to the first surface;
   wherein the liquid metal is formed between adjacent two of the pillars.

6. The semiconductor device as claimed in claim 3, wherein the cover has a second surface opposite to the first surface, and the cover further has a first through hole extending to the second surface from the first surface.

7. The semiconductor device as claimed in claim 6, wherein the first through hole is located at middle position of the second surface.

8. The semiconductor device as claimed in claim 6, wherein the cover further has a second through hole extending to the second surface from the first surface.

9. The semiconductor device as claimed in claim 3, further comprises:
   a first adhesive layer disposed between a terminal of the first surrounding portion and the electronic component.

10. The semiconductor device as claimed in claim 6, further comprises:
    a first seal closing the first through hole.

11. The semiconductor device as claimed in claim 10, wherein there is space between the first seal and the liquid metal.

12. A manufacturing method, comprising:
    disposing an electronic component on a substrate;
    disposing a cover on the substrate to cover the electronic component, wherein the cover comprises a first surrounding portion and a second surrounding portion, and there is space located between the first surrounding portion and the second surrounding portion; and
    forming a liquid metal between the cover and the electronic component, wherein the first surrounding portion surrounds the liquid metal.

13. The manufacturing method as claimed in claim 12, wherein the liquid metal has melting point ranging between 60° C. to 70° C.

14. The manufacturing method as claimed in claim 12, wherein in step of disposing the cover on the substrate to cover the electronic component, the cover comprises a plate and the first surrounding portion, the plate has a first surface facing the electronic component, and the first surrounding portion is disposed on the plate and protrudes with respect to the first surface; step of forming the liquid metal between the cover and the electronic component further comprises:
    forming the liquid metal between the plate and the electronic component.

15. The manufacturing method as claimed in claim 14, wherein the first surrounding portion is a closed-ring.

16. The manufacturing method as claimed in claim 12, wherein in step of disposing the cover on the substrate to cover the electronic component, the cover comprises a plate and a plurality of pillars, the cover has a first surface facing the electronic component, and the pillars are disposed on the plate and protrude with respect to the first surface; step of forming the liquid metal between the cover and the electronic component further comprises:
    forming the liquid metal between adjacent two of the pillars.

17. The manufacturing method as claimed in claim 14, wherein the cover has a second surface opposite to the first surface, and the cover further has a first through hole extending to the second surface from the first surface.

18. The manufacturing method as claimed in claim 17, wherein in step of disposing the cover on the substrate to cover the electronic component, the first through hole is located at middle position of the second surface.

19. The manufacturing method as claimed in claim 17, wherein in step of disposing the cover on the substrate to cover the electronic component, the cover further has a second through hole extending to the second surface from the first surface.

20. The manufacturing method as claimed in claim 14, further comprises:
    disposing a first adhesive layer between a terminal of the first surrounding portion and the electronic component.

21. The manufacturing method as claimed in claim 17, further comprises:
    closing the first through hole with a first seal.

22. The manufacturing method as claimed in claim 21, wherein in step of closing the first through hole with the first seal, there is space between the first seal and the liquid metal.

* * * * *